(12) United States Patent
Sah et al.

(10) Patent No.: US 12,066,763 B2
(45) Date of Patent: Aug. 20, 2024

(54) SENSITIVITY IMPROVEMENT OF OPTICAL AND SEM DEFECTION INSPECTION

(71) Applicant: KLA Corporation, Milpitas, CA (US)

(72) Inventors: Kaushik Sah, Milpitas, CA (US); Andrew James Cross, Cheshire (GB); Sandip Halder, Milpitas, CA (US); Sayantan Das, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 70 days.

(21) Appl. No.: 17/168,042

(22) Filed: Feb. 4, 2021

(65) Prior Publication Data

US 2022/0244648 A1 Aug. 4, 2022

(51) Int. Cl.
*G03F 7/00* (2006.01)
*H01L 21/027* (2006.01)

(52) U.S. Cl.
CPC ............ *G03F 7/7065* (2013.01); *G03F 7/702* (2013.01); *G03F 7/70625* (2013.01); *H01L 21/0274* (2013.01)

(58) Field of Classification Search
CPC .... G03F 7/702; G03F 7/70625; G03F 7/7065; H01L 21/0274
See application file for complete search history.

(56) References Cited

U.S. PATENT DOCUMENTS

| 8,213,704 B2 | 7/2012 | Peterson et al. |
| 9,768,062 B1* | 9/2017 | Kittl ................... H01L 21/76897 |
| 10,551,827 B2 | 2/2020 | Duffy |
| 2004/0135827 A1 | 7/2004 | Kuramata et al. |
| 2011/0222179 A1* | 9/2011 | Monadgemi ......... G02B 6/3512 427/164 |
| 2012/0113416 A1 | 5/2012 | Lange et al. |
| 2016/0041092 A1 | 2/2016 | Urano et al. |
| 2019/0178798 A1 | 6/2019 | Li et al. |

FOREIGN PATENT DOCUMENTS

WO 2020123416 A1 6/2020

OTHER PUBLICATIONS

International Search Report in International Application No. PCT/US2022/014175 dated May 18, 2022, 9 pages.
Lee et al., "Accelerating litho technology development for advanced design node flash memory FEOL by next-generation wafer inspection and SEM review platforms," Proc. SPIE, vol. 8324 832429 (2012), 12 pages.
Sárosi, Zoltán et al, "Evaluation of reflectivity of metal parts by a thermo-camera", InfraMation 2010 Proceedings, pp. 210-243.

* cited by examiner

*Primary Examiner* — Deoram Persaud
(74) *Attorney, Agent, or Firm* — Suiter Swantz IP (57) ABSTRACT

A characterization system for inspecting or performing metrology on a layer within a semiconductor stack is disclosed. The system includes an imaging sub-system configured to acquire image data from a semiconductor stack including one or more layers. The semiconductor stack includes a metal layer having a thickness between 0.5 and 10 nm deposited on a layer of the semiconductor stack to form a reflective surface on the layer. The system includes a controller. The controller is configured to receive image data of the reflective surface on the layer of the substrate stack and identify one or more defects or one or more structures within the layer based on illumination reflected from the reflective surface.

45 Claims, 9 Drawing Sheets

SENSITIVITY IMPROVEMENT OF OPTICAL AND SEM DEFECTION INSPECTION

TECHNICAL FIELD

The present disclosure relates generally to inspection and metrology and, more particularly, to optical and SEM inspection and metrology of resist structures in a semiconductor stack utilizing an ultrathin metal layer to enhance detection sensitivity.

BACKGROUND

As the demand for integrated circuits having ever-smaller device features continues to increase, the need for improved substrate inspection approaches continues to grow. One such inspection technology includes reticle inspection. Optical inspection of resists has been challenging due to low sensitivity of inspection systems often failing to detect smaller defects as design rules shrink. Previous attempts at boosting the signal-to-noise ratio (SNR) for defect defection of an After Development Inspection (ADI) wafer have proven lacking. Therefore, it would be desirable to provide a method and system that cures the shortfalls of the prior approaches.

SUMMARY

A method of characterizing a layer within a semiconductor stack is disclosed, in accordance with one or more embodiments of the present disclosure. In one illustrative embodiment, the method includes receiving a semiconductor stack including one or more layers. In another illustrative embodiment, the method includes depositing a metal on a layer of the semiconductor stack to form a reflective surface having a thickness between 0.5 and 10 nm. In another illustrative embodiment, the method includes imaging the reflective surface on the layer of the semiconductor stack to identify one or more defects or structures within the layer.

A system for characterizing a layer within a semiconductor stack is disclosed, in accordance with one or more embodiments of the present disclosure. In one illustrative embodiment, the system includes an imaging sub-system configured to acquire image data from a semiconductor stack including one or more layers, wherein the semiconductor stack includes a metal layer having a thickness between 0.5 and 10 nm deposited on a layer of the semiconductor stack to form a reflective surface on the layer. In another illustrative embodiment, the system includes a controller communicatively coupled to the imaging sub-system, the controller including one or more processors configured to execute program instructions causing the one or more processors to: receive image data of the reflective surface on the layer of the substrate stack from the imaging sub-system; and identify one or more defects or one or more structures within the layer based on illumination reflected from the reflective surface.

BRIEF DESCRIPTION OF DRAWINGS

The numerous advantages of the disclosure may be better understood by those skilled in the art by reference to the accompanying figures.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to sensitivity improvement in optical and charged-particle inspection and metrology systems utilized in the semiconductor industry. Embodiments of the present disclosure are directed to the deposition of one or more selected metals onto a selected layer of a semiconductor stack to boost the signal-to-noise ratio (SNR) for defect detection following a selected lithographic process (e.g., development, etch, clean). The metal may be deposited onto a photoresist (e.g., Chemically Amplified Resist (CAR), metal-containing resist, metal oxide resist) after development of the photoresist or after an etch process. In addition, the metal may be deposited onto a structure underlying the photoresist following removal of the photoresist during a clean/stripping process. Additional embodiments of the present disclosure are directed to the deposition of one or more selected metals onto a selected layer of a semiconductor stack to enhance contrast of one or more structures within the selected layer. For instance, the deposition of the one or more selected metals may serve to enhance SNR at a defect location, allowing metrology (e.g., scanning electron microscopy (SEM) metrology, transmission electron microscopy (TEM), optical metrology, and the like) of the identified defect without additional material deposition. In this regard, both inspection and metrology of a given defect may be performed with one deposition.

Figure 1A:
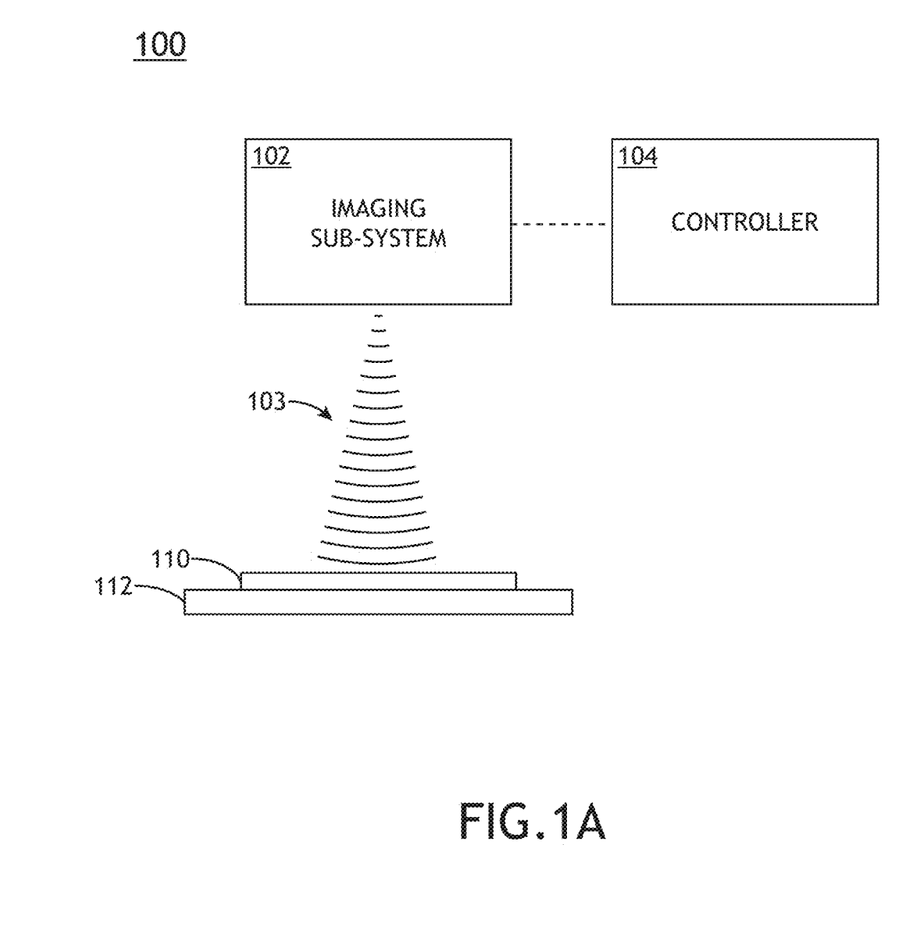
FIG. 1A is a conceptual view of a characterization system configured for inspection or metrology of one or more layers of a semiconductor stack, in accordance with one or more embodiments of the present disclosure.

FIG. 1A illustrates a conceptual view of a characterization system 100 for inspection or metrology of one or more layers of a semiconductor stack 110 coated with a selected metal, in accordance with one or more embodiments of the present disclosure. The system 100 may include imaging sub-system 102 and controller 104. In embodiments, the imaging sub-system 102 may be configured to acquire image data from any selected layer of semiconductor stack 110 as the semiconductor stack 110 is fabricated. In embodiments, the semiconductor stack 110 is coated with an ultrathin metal layer having a thickness between 0.5 and 10 nm, which is deposited on a layer of the semiconductor stack 110. The metal layer forms a reflective surface on the layer (e.g., photoresist). The imaging sub-system 102 may direct illumination 103 to the semiconductor stack 110 disposed on a stage 112. The imaging sub-system 102 may then collect (e.g., via camera) radiation emanating (e.g., reflected, scattered, or diffracted) from the reflective surface of the semiconductor stack 110 coated with metal. In embodiments, the controller 104 is communicatively coupled to the imaging sub-system 102 and is configured to receive image data of the reflective surface disposed on the layer of the substrate stack 110 from the imaging sub-system 102. Then, the controller 104 may identify one or more defects or one or more structures within the layer based on illumination reflected from the reflective surface of the substrate stack 110.

The imaging sub-system 102 may include any optical sub-system 102 known in the art. For the purposes of the present disclosure, the term 'characterization system' is interchangeable with the term 'characterization tool.' In this sense, the imaging sub-system 102 and the controller 104 may form the characterization system 100 (or characterization tool). It is noted that the characterization system 100 may include any characterization system/tool known in the art. For example, the characterization system 100 may include an inspection system for detecting one or more defects within one or more layers of the semiconductor stack 110. By way of another example, the characterization system 100 may include a metrology system for measuring one or more structures (e.g., measuring one or more critical dimensions of one or more structures) within one or more layers of the semiconductor stack 110.

The characterization system 100 may include any inspection or imaging-based metrology system known in the art. For example, the characterization system 100 may include an optical characterization system, such as an optical inspection system or metrology system, configured to characterize the semiconductor stack 110 using light having a wavelength (or range of wavelengths) between 100 and 1000 nm. For instance, the characterization system 100 may include a broadband plasma (BBP) inspection system or imaging-based metrology system. In another instance, the characterization system 100 may include a laser scanning inspection system or imaging-based metrology system. By way of another example, the characterization system 100 may include a charged-particle based characterization system, such as a charged-particle inspection system or metrology system, configured to characterize the semiconductor stack 110 using charged particles. For instance, the characterization system 100 may include a scanning electron microscopy (SEM) inspection system or imaging-based metrology system. In another instance, the characterization system 100 may include a transmission mode electron microscopy (TEM) inspection system or imaging-based metrology system.

Figure 1B:
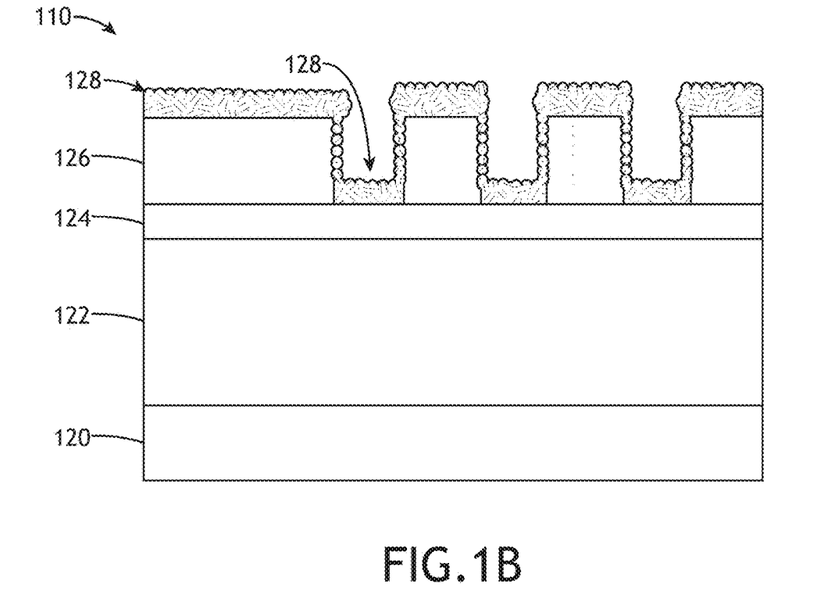
FIG. 1B is a cross-sectional view of a semiconductor stack, in accordance with one or more embodiments of the present disclosure.
Figure 1C:
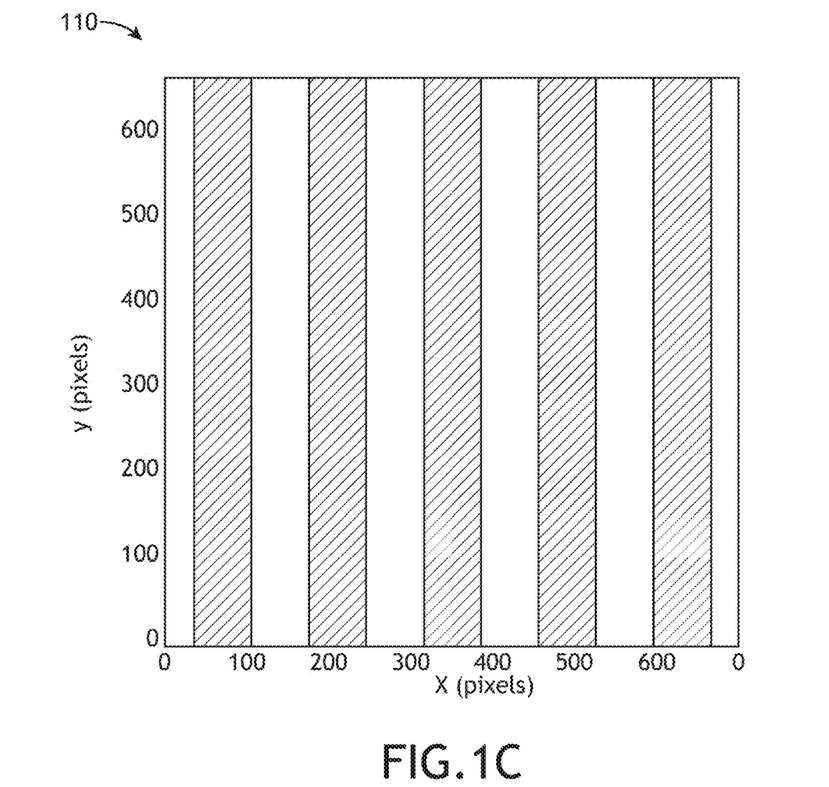
FIG. 1C is a top plan view of a semiconductor stack, in accordance with one or more embodiments of the present disclosure.
Figure 1D:
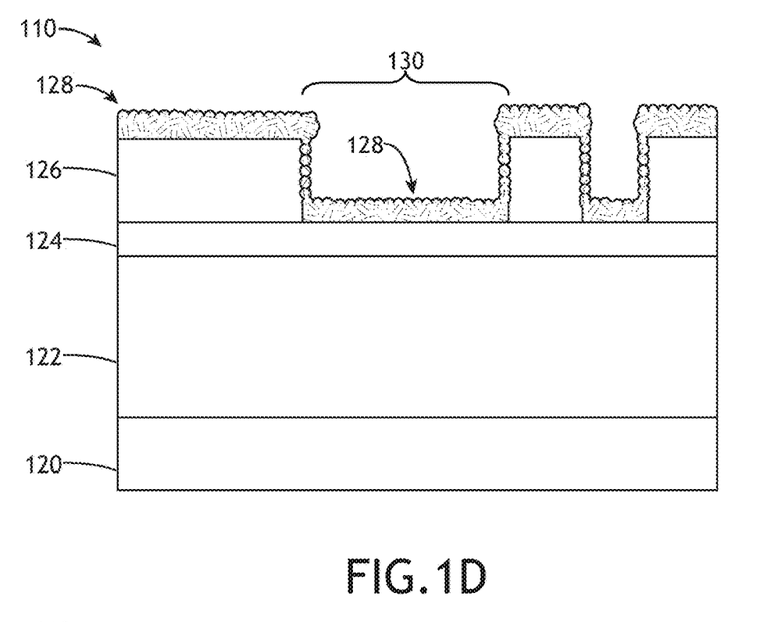
FIG. 1D is a cross-sectional view of a semiconductor stack including a gap defect in a photoresist layer, in accordance with one or more embodiments of the present disclosure.
Figure 1E:
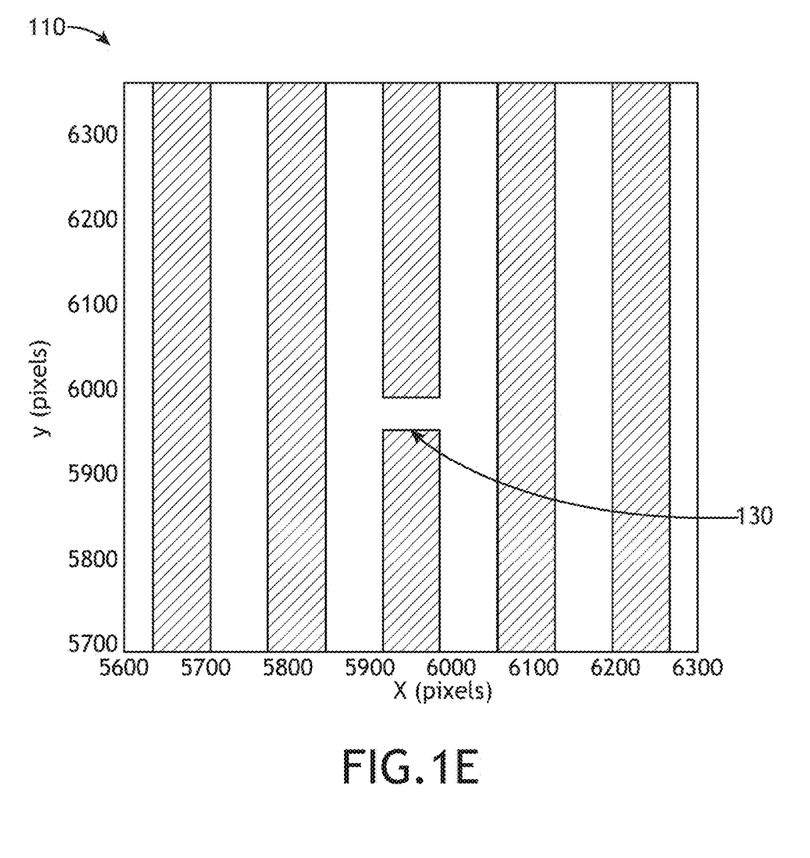
FIG. 1E is a top plan view of a semiconductor stack including a gap defect in a photoresist layer, in accordance with one or more embodiments of the present disclosure.

FIGS. 1B and 1C illustrate cross-section and top plan views respectively of the semiconductor stack 110 with no defects present, while FIGS. 1D and 1E illustrate cross-section and top plan views of the semiconductor stack 110 displaying a gap defect 130 in the photomask.

The semiconductor stack 110 may include any layers formed/processed in a semiconductor device fabrication process. It is noted that the semiconductor stack 110 depicted in FIG. 1B should not be interpreted as a limitation on the scope of the present disclosure as any type of semiconductor stack may be utilized within the context of the present disclosure. Moreover, the system 100 may image the semiconductor stack 110 at any stage of the fabrication process and, thus, may image any of the layers within the semiconductor stack 110.

The semiconductor stack 110 may include a substrate 120. For example, the substrate 120 may include a silicon wafer. The semiconductor stack 110 may include a mask 122 disposed on the substrate 120. For example, the semiconductor stack 110 may include a hard mask and integration stack disposed on a silicon wafer. The semiconductor stack 110 may include one or more underlayers 124. For example, the one or more underlayers may be disposed on the mask/integration stack. The one or more underlayers 124 may include any underlayers known in the art. For example, the one or more underlayers 124 may include one or more organic or inorganic underlayers. The semiconductor stack 110 may include a photoresist layer or a photoresist system 126. For example, the photoresist layer/photoresist system 126 may be disposed on the one or more underlayers 124 or substrate 120. The semiconductor stack 110 may include any photoresist layer or photoresist system known in the art. For example, photoresist layer/photoresist system 126 of the semiconductor stack 110 may include a chemically amplified photoresist, a photoresist containing one or more metals, or a metal oxide photoresist.

In embodiments, a metal may be deposited on any layer of the semiconductor stack 110 at any stage of processing of the semiconductor stack 110. Then, the imaging sub-system 102 may image the reflective surface 128 formed by the metal in an inspection/metrology step to identify one or more defects (e.g., gap defect 130) within the selected layer or characterize one or more structures (e.g., measure size of gap defect 130) within the selected layer.

For example, a metal may be deposited on the photoresist layer or a topcoat of a photoresist system 126 after development of the photoresist layer to form a reflective surface 128 on the photoresist layer or a topcoat of a photoresist system 126. In this sense, the metal may be deposited on an After Development Inspection (ADI) wafer. In turn, the imaging sub-system 102 may perform an inspection or metrology step by imaging the reflective surface 128 deposited on the photoresist layer/topcoat of the photoresist system 126 to identify defects within the photoresist layer/topcoat of the photoresist system 126 or measure one or more structures within the photoresist layer/topcoat of the photoresist system 126.

By way of another example, a metal may be deposited on the photoresist layer or a topcoat of a photoresist system 126 after an etch process to form a reflective surface 128 on the photoresist layer or a topcoat of a photoresist system 126. In this sense, the metal may be deposited on an After Etch Inspection (AEI) wafer. In turn, the imaging sub-system 102 may perform an inspection or metrology step by imaging the reflective surface 128 deposited on the photoresist layer/topcoat of the photoresist system 126 to identify defects within the photoresist layer/topcoat of the photoresist system 126 or measure one or more structures within the photoresist layer/topcoat of the photoresist system 126.

By way of another example, a metal may be deposited on the one or more underlayers 124 or the substrate 120 to form a reflective surface 128, after a cleaning or stripping process is applied post-etch to remove the photoresist layer/photoresist system 126. In this sense, the metal may be deposited on an After Cleaning Inspection (ACI) wafer. In turn, the imaging sub-system 102 may perform an inspection or metrology step by imaging the reflective surface 128 deposited on the one or more underlayers 124 or substrate 120 to identify defects within the the one or more underlayers 124 or substrate 120 or measure one or more structures within the one or more underlayers 124 or substrate 120. ADI, AEI, and ACI wafers are described and depicted by Lee et al., "*Accelerating litho technology development for advanced design node flash memory FEOL by next-generation wafer inspection and SEM review platforms,*" Proc. SPIE, Vol. 8324 832429 (2012), which is incorporated herein by reference in the entirety.

In embodiments, the metal may be deposited on a layer of the semiconductor stack at a thickness between 0.5 and 10 nm. For example, the chosen metal may be deposited at a thickness between 1 and 6 nm. It is noted herein that the ultra-low deposition thicknesses of the metal has shown to boost signal-to-noise ratio (SNR) in imaging measurements (e.g., BBP optical inspection). In embodiments, the metal is deposited via a physical vapor deposition (PVD) process. For example, the metal may be deposited with top-down directionality. As a result of the top-down directionality of the metal deposition, very little metal is deposited on the side walls of the photoresist walls of the photoresist layer/photoresist system 126, with most of the metal deposited on the top of the photoresist or at the bottom of the photoresist patterns as shown in FIG. 1B.

The metal layer 128 may include one or more metals displaying high reflectivity in the wavelength range 100-1000 nm. For example, the metal layer 128 may include aluminum, molybdenum, nickel, chromium, tungsten, rhodium, vanadium, or palladium or a compound of two or more of these metals. It is noted that the choice of metal(s) may be based on the wavelength regime utilized by the imaging sub-system 102. In this regard, optical simulations may be performed utilizing the configuration of the imaging sub-system 102 to determine the metal(s) that maximize the SNR for defects within the selected layers of the semiconductor stack 110.

Figure 2:
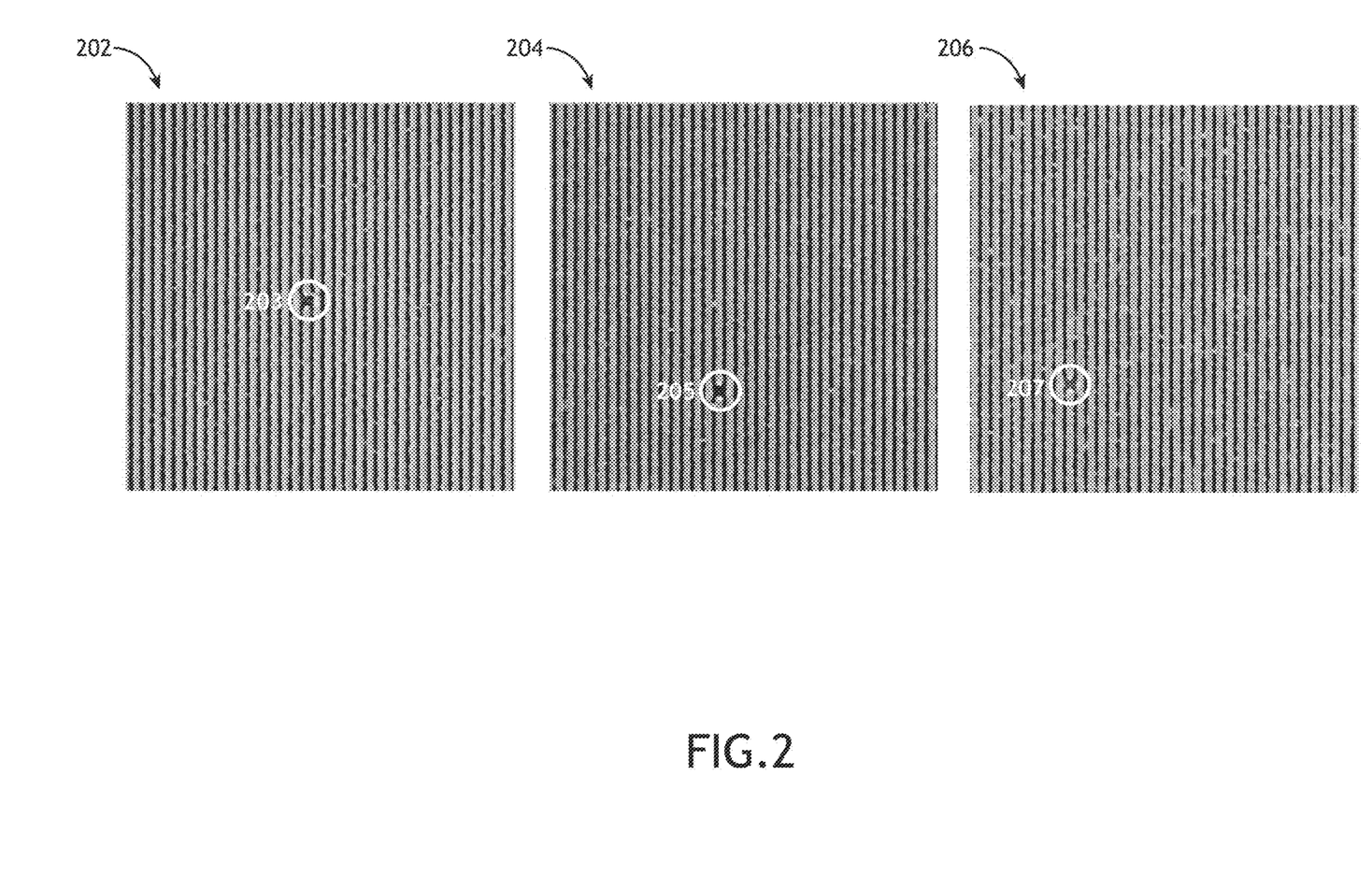
FIG. 2 depicts a series of microscopy images obtained with 1 nm, 3 nm, and 5 nm thick layers of metal deposited on the photoresist layer prior to imaging, in accordance with one or more embodiments of the present disclosure.

FIG. 2 illustrates images 202, 204, and 206 displaying gap defects 203, 205, and 207 respectively, in accordance with one or more embodiments of the present disclosure. It is noted that the specimens displayed in images 202, 204, and 206 were fabricated to include a programmed gap defect. The specimen in image 202 includes a 1 nm layer of molybdenum formed on the photoresist layer of the semiconductor stack. The specimen in image 204 includes a 3 nm layer of molybdenum formed on the photoresist layer of the semiconductor stack. The specimen in image 206 includes a 5 nm layer of molybdenum formed on the photoresist layer of the semiconductor stack. As observed in images 202, 204, and 206 the programmed defects 203, 205, 207 were observed in each image. It is noted that the use of the metal layer allows for the capture of program defects that were not observable without the metal layer, especially in the case of inspecting an ADI wafer. In addition, the deposition of the metal at the 1 nm, 3 nm, and 5 nm thickness only had a margin effect on the line critical dimension (e.g., thickness of lines/spaces between lines) in the pattern observed in images 202, 204, and 206.

Figure 3:
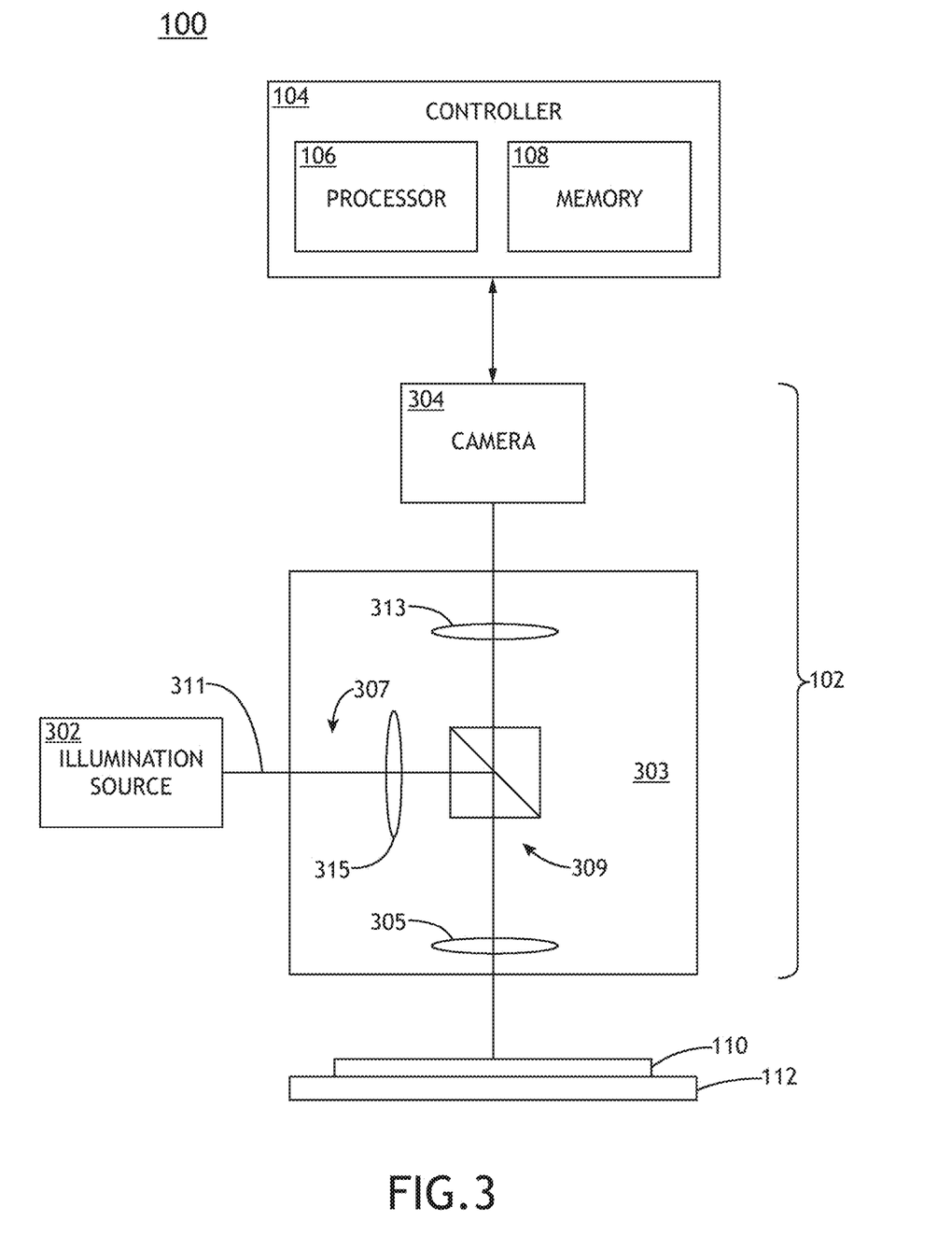
FIG. 3 is a simplified schematic view of the characterization system, in accordance with one or more embodiments of the present disclosure.

FIG. 3 is a simplified schematic view of the characterization system 100, in accordance with one or more embodiments of the present disclosure. The system 100 may generate one or more images of the semiconductor stack 110 on at least one camera 304 using any method known in the art. In embodiments, as discussed, the system 100 includes an imaging sub-system 102 and a controller 104.

The imaging sub-system 102 includes an illumination source 302 to generate an illumination beam 311. The illumination source 302 may include any illumination source known in the art. For example, the illumination source 302 may include a broadband (e.g., plasma broadband source) or a narrowband (e.g., one or more lasers) source. The illumination beam 311 may include one or more selected wavelengths of light including, but not limited to, vacuum ultraviolet (VUV) light, deep ultraviolet (DUV) light, ultraviolet (UV) light, visible light, or infrared (IR) light. The illumination source 302 may further produce an illumination beam 311 having any temporal profile. For example, the illumination source 302 may produce a continuous illumination beam 311, a pulsed illumination beam 311, or a modulated illumination beam 311. Additionally, the illumination beam 311 may be delivered from the illumination source 302 via free-space propagation or guided light (e.g., an optical fiber, a light pipe, or the like).

In embodiments, the imaging sub-system 102 includes a set of optics 303. The illumination source 302 directs the illumination beam 311 to the semiconductor stack 110 via an illumination pathway 307. The illumination pathway 307 may include one or more optical components 315 suitable for modifying and/or conditioning the illumination beam 311. For example, the one or more illumination optical components 315 may include, but are not limited to, one or more lenses, one or more mirrors, one or more polarizers, one or more filters, one or more beam splitters, one or more diffusers, one or more homogenizers, one or more apodizers, or one or more beam shapers. In embodiments, the imaging sub-system 102 includes an objective lens 305 to focus the illumination beam 311 onto the semiconductor stack 110.

In embodiments, the semiconductor stack 110 is disposed on a sample stage 112. The sample stage 112 may include any device suitable for positioning/rotating the semiconductor stack 110 within the system 100. For example, the sample stage 112 may include any combination of linear translation stages, rotational stages, tip/tilt stages or the like.

In embodiments, camera 304 (or detector/sensor) is configured to capture illumination emanating from the reflective metal surface 128 of the semiconductor stack 110 through a collection pathway 309. The collection pathway 309 may include any number of collection optical components 313 to direct and/or modify illumination collected by the objective lens 305 including, but not limited to, one or more lenses, one or more mirrors, one or more polarizers, one or more filters, one or more beam splitters, one or more diffusers, one or more homogenizers, one or more apodizers, or one or more beam shapers.

The camera 304 may include any camera or detector system known in the art suitable for measuring and/or imaging illumination received from the semiconductor stack 110 and reference point targets 110. For example, the camera 304 may include one or more sensors suitable for generating one or more images of semiconductor stack 110 and reference point targets 110 such as, but is not limited to, a charge-coupled device (CCD), a complementary metal-oxide-semiconductor (CMOS) sensor, a photomultiplier tube (PMT) array, or an avalanche photodiode (APD) array. By way of another example, a detector 304 may include a sensor suitable for generating one or more images of the semiconductor stack 110 and reference point targets 110 in motion (e.g., a scanning mode of operation). For instance, the camera 304 may include a line sensor including a row of pixels. In this regard, the system 100 may generate a continuous image (e.g., a strip image) one row at a time by translating the semiconductor stack 110 in a scan direction perpendicular to the pixel row through a measurement field of view and continuously clocking the line sensor during a continuous exposure window. In another instance, the camera 304 may include a TDI sensor including multiple pixel rows and a readout row. The TDI sensor may operate in a similar manner as the line sensor, except that clocking signals may successively move charge from one pixel row to the next until the charge reaches the readout row, where a row of the image is generated. By synchronizing the charge transfer (e.g., based on the clocking signals) to the motion of the sample along the scan direction, charge may continue to build up across the pixel rows to provide a relatively higher signal to noise ratio compared to the line sensor.

In another embodiment, the controller 104 includes one or more processors 106 configured to execute program instructions maintained on a memory medium 108. In this regard, the one or more processors 106 of controller 104 may execute any of the various process steps described throughout the present disclosure. Further, the controller 104 may be configured to receive data including, but not limited to, images of the semiconductor stack 110 from the detector 304.

The one or more processors 106 of a controller 104 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 106 may include any device configured to execute algorithms and/or instructions (e.g., program instructions stored in memory). In embodiments, the one or more processors 106 may be embodied as a desktop computer, mainframe computer system, workstation, image computer, parallel processor, networked computer, or any other computer system configured to execute a program configured to operate or operate in conjunction with the system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 104 may include one or more controllers housed in a common housing or within multiple housings. In this way, any controller or combination of controllers may be separately packaged as a module suitable for integration into system 100. Further, the controller 104 may analyze data received from the detector 104 and feed the data to additional components within the system 100 or external to the system 100.

The memory medium 108 may include any storage medium known in the art suitable for storing program instructions executable by the associated one or more processors 106. For example, the memory medium 108 may include a non-transitory memory medium. By way of another example, the memory medium 108 may include, but is not limited to, a read-only memory (ROM), a random-access memory (RAM), a magnetic or optical memory device (e.g., disk), a magnetic tape, a solid-state drive and the like. It is further noted that memory medium 108 may be housed in a common controller housing with the one or more processors 106. In embodiments, the memory medium 108 may be located remotely with respect to the physical location of the one or more processors 106 and controller 104. For instance, the one or more processors 106 of controller 104 may access a remote memory (e.g., server), accessible through a network (e.g., internet, intranet and the like).

It is noted that, while FIG. 3 has focused on an optically-based characterization system, this is not a limitation on the scope of the present disclosure. It is noted that the characterization system 100 may include an SEM-based imaging system or a TEM-based imaging system. An SEM-based imaging/inspection system is described in U.S. Pat. No. 10,551,827, issued on Feb. 4, 2020, which is incorporated herein by reference. A TEM-based imaging/inspection system is described in U.S. Pat. No. 8,213,704, issued on Jul. 3, 2012, which is incorporated herein by reference.

Figure 4:
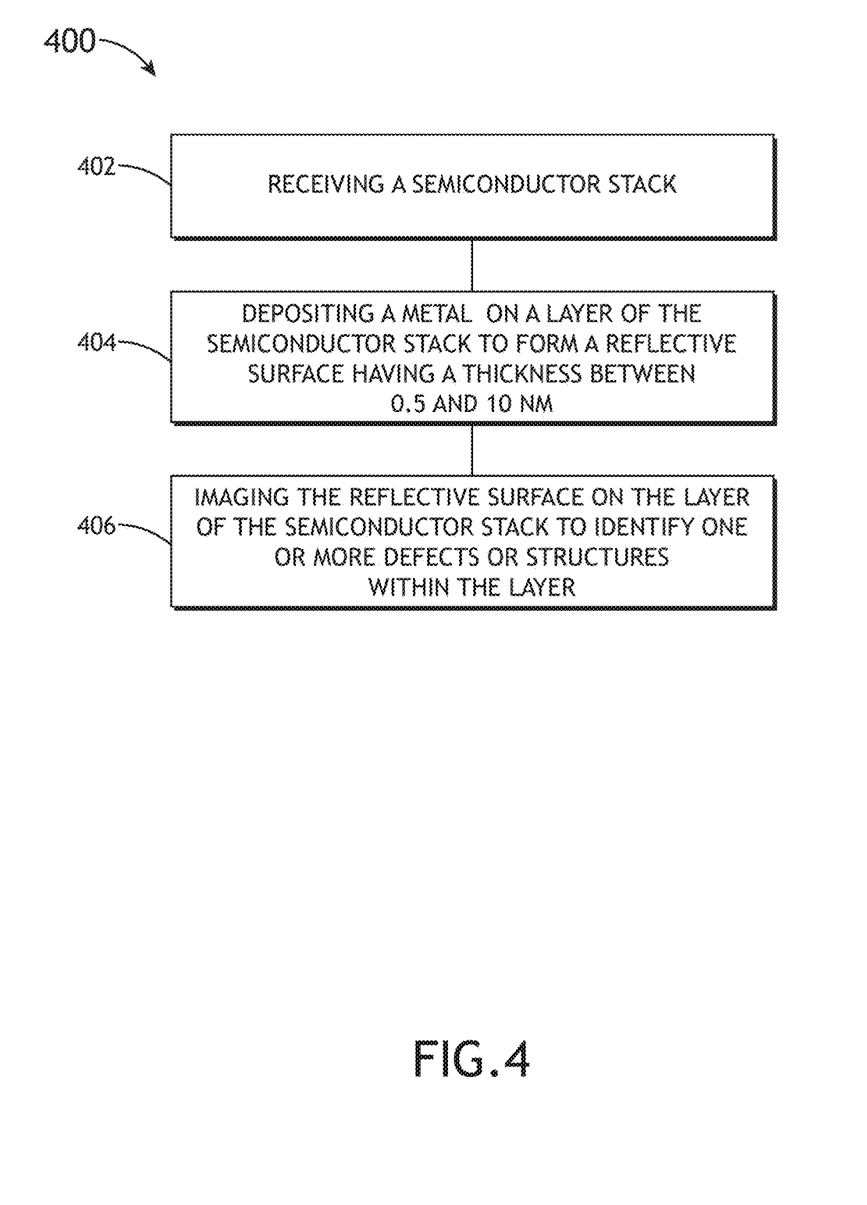
FIG. 4 illustrates a flow diagram depicting a method of characterizing one or more layers of a semiconductor stack, in accordance with one or more embodiments of the present disclosure.

FIG. 4 illustrates a flow diagram 400 depicting a method of characterizing one or more layers of a semiconductor stack, in accordance with one or more embodiments of the present disclosure. Applicant notes that the embodiments and enabling technologies described previously herein in the context of the characterization system 100 should be interpreted to extend to the method 400. It is further noted, however, that the method 400 is not limited to the architecture of the characterization system 100. In step 402, the method receives a semiconductor stack including one or more layers. In step 404, the method deposits a metal on a layer of the semiconductor stack to form a reflective surface having a thickness between 0.5 and 10 nm. In step 406, the method images the reflective surface on the layer of the semiconductor stack to identify one or more defects or structures within the layer.

Figure 5:
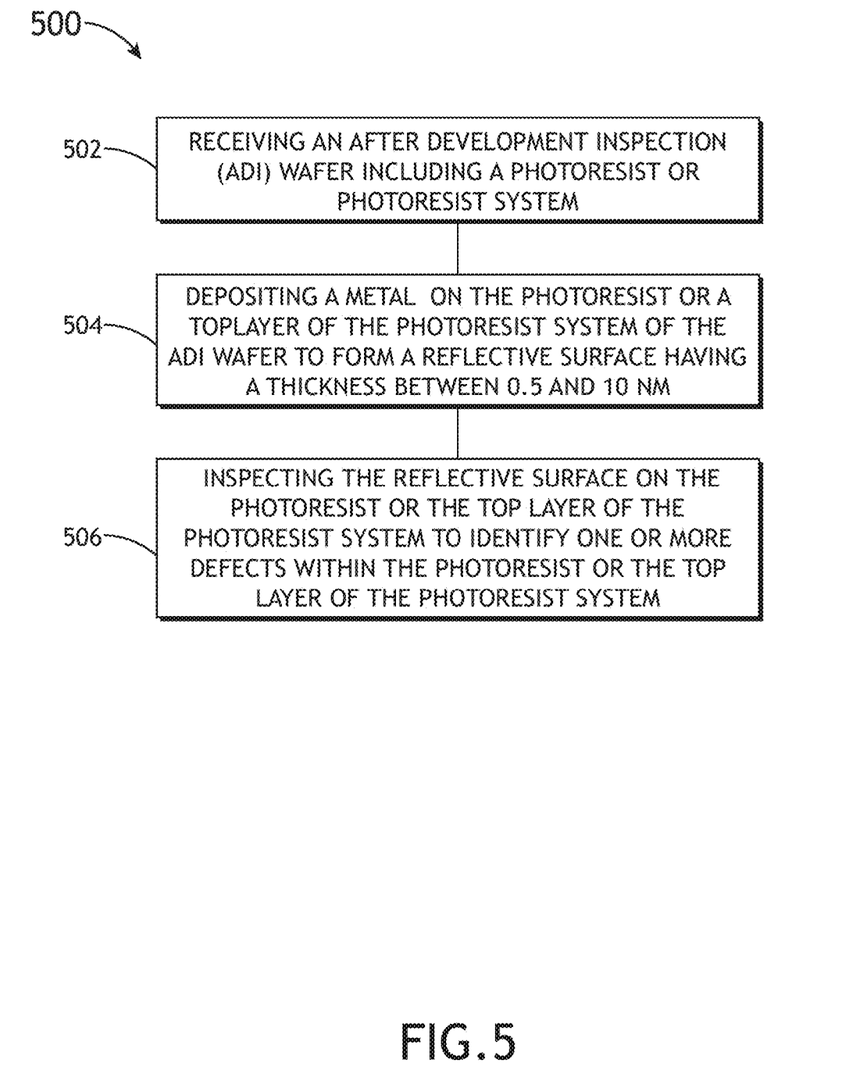
FIG. 5 illustrates a flow diagram depicting a method of characterizing a photoresist or photoresist system of an After Development Inspection (ADI) wafer, in accordance with one or more embodiments of the present disclosure.

FIG. 5 illustrates a flow diagram 500 depicting a method of characterizing a photoresist or photoresist system of an ADI wafer, in accordance with one or more embodiments of the present disclosure. Applicant notes that the embodiments and enabling technologies described previously herein in the context of the characterization system 100 should be interpreted to extend to the method 500. It is further noted, however, that the method 500 is not limited to the architecture of the characterization system 100. In step 502, the method includes receiving ADI wafer including a photoresist or photoresist system. In step 504, the method includes depositing a metal on the photoresist or a top layer of the photoresist system of the ADI wafer to form a reflective surface having a thickness between 0.5 and 10 nm. In step 506, the method includes inspecting the reflective surface on the photoresist or the top layer of the photoresist system to identify one or more defects within the photoresist or the top layer of the photoresist system.

Figure 6:
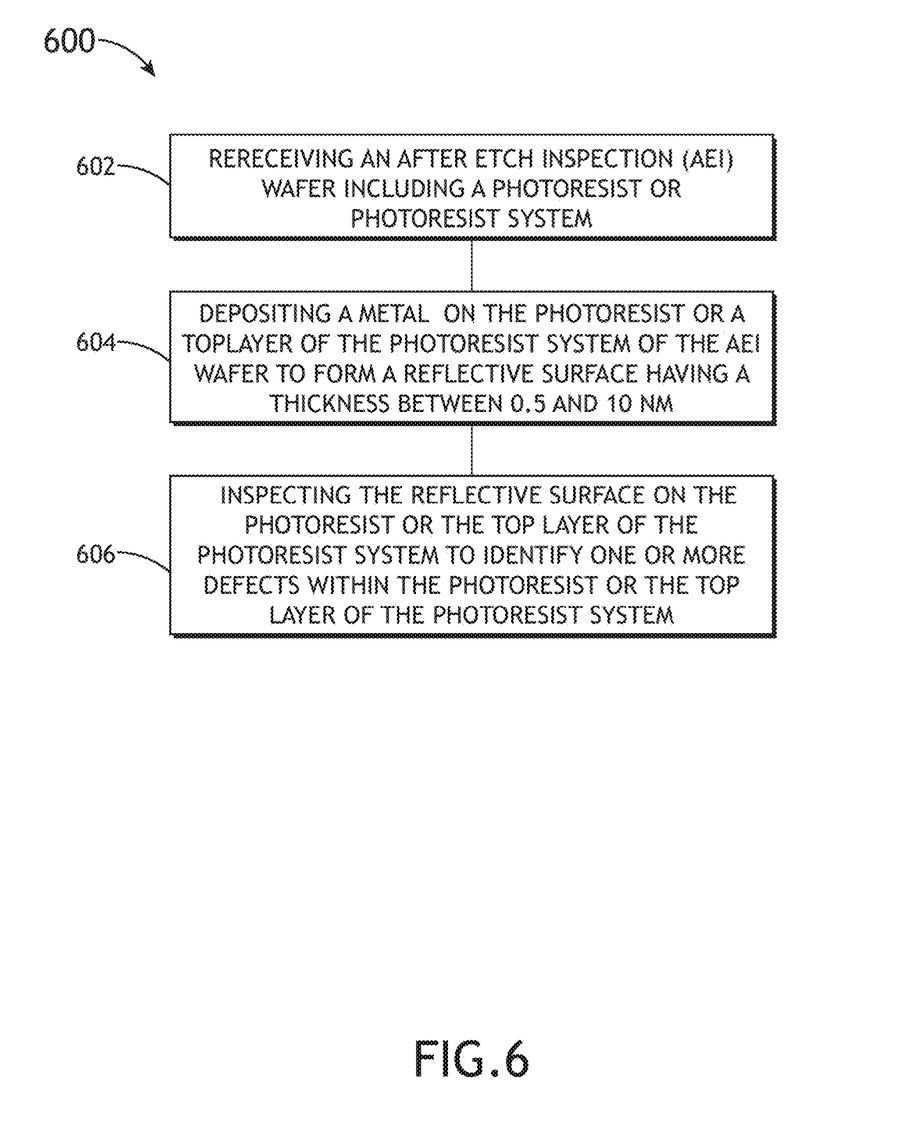
FIG. 6 illustrates a flow diagram depicting a method of characterizing a photoresist or photoresist system of an After Etch Inspection (AEI) wafer, in accordance with one or more embodiments of the present disclosure.

FIG. 6 illustrates a flow diagram 600 depicting a method of characterizing a photoresist or photoresist system of an AEI wafer, in accordance with one or more embodiments of the present disclosure. Applicant notes that the embodiments and enabling technologies described previously herein in the context of the characterization system 100 should be interpreted to extend to the method 600. It is further noted, however, that the method 600 is not limited to the architecture of the characterization system 100. In step 602, the method includes receiving an AEI wafer including a photoresist or photoresist system. In step 604, the method includes depositing a metal on the photoresist or a top layer of the photoresist system of the AEI wafer to form a reflective surface having a thickness between 0.5 and 10 nm. In step 606, the method includes inspecting the reflective surface on the photoresist or the top layer of the photoresist system to identify one or more defects within the photoresist or the top layer of the photoresist system.

Figure 7:
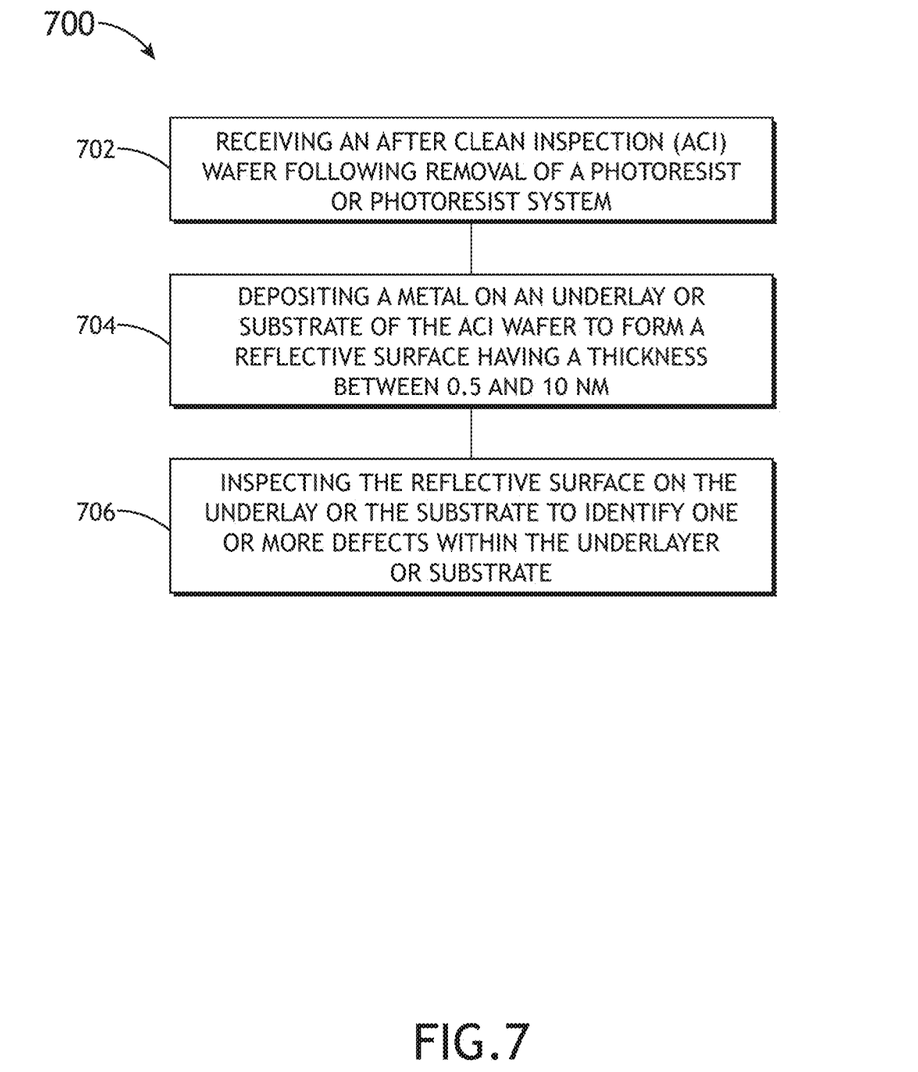
FIG. 7 illustrates a flow diagram depicting a method of characterizing one or more layers of an After Clean Inspection (ACI) wafer, in accordance with one or more embodiments of the present disclosure.

FIG. 7 illustrates a flow diagram 700 depicting a method of characterizing one or more layers of an ACI wafer, in accordance with one or more embodiments of the present disclosure. Applicant notes that the embodiments and enabling technologies described previously herein in the context of the characterization system 100 should be interpreted to extend to the method 700. It is further noted, however, that the method 700 is not limited to the architecture of the characterization system 100. In step 702, the method includes receiving an ACI wafer following removal of a photoresist or photoresist system. In step 704, the method includes depositing a metal on an underlay or substrate of the ACI wafer to form a reflective surface having a thickness between 0.5 and 10 nm. In step 706, the method includes inspecting the reflective surface on the underlay or the substrate to identify one or more defects within the underlayer or substrate.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently, "temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

The invention claimed is:

1. A method of characterizing a semiconductor stack comprising:
   receiving a semiconductor stack including one or more layers;
   depositing at least one of molybdenum, nickel, tungsten, rhodium, vanadium, or palladium on a layer of the semiconductor stack, via top-down directional physical vapor deposition, to form a reflective surface having a thickness between 0.5 and 10 nm; and
   imaging the reflective surface on the layer of the semiconductor stack to identify one or more gap defects within the layer.

2. The method of claim 1, wherein the semiconductor stack comprises:
   a substrate;
   a mask disposed on the substrate;
   one or more underlayers deposited on the substrate; and
   at least one of a photoresist layer or a photoresist system disposed on the one or more underlayers or substrate.

3. The method of claim 2, wherein the photoresist layer comprises at least one of a chemically amplified photoresist, a photoresist containing metal, or a metal oxide photoresist.

4. The method of claim 2, wherein the one or more underlayers comprises an organic or inorganic underlayer or underlayers.

5. The method of claim 1, wherein the depositing a metal on the layer of the semiconductor stack to form the reflective surface having a thickness between 0.5 and 10 nm comprises:
   depositing a metal on the layer of the semiconductor stack, via physical vapor deposition, to form a reflective surface having a thickness between 0.5 and 10 nm.

6. The method of claim 1, wherein the depositing a metal on the layer of the semiconductor stack to form a reflective surface having a thickness between 0.5 and 10 nm comprises:
   depositing a metal on a photoresist layer or a topcoat of a photoresist system after development of the photoresist layer of the semiconductor stack to form a reflective surface having a thickness between 0.5 and 10 nm.

7. The method of claim 1, wherein the depositing a metal on the layer of the semiconductor stack to form a reflective surface having a thickness between 0.5 and 10 nm comprises:
   depositing a metal on a photoresist layer or a topcoat of a photoresist system after etching of the photoresist layer of the semiconductor stack to form a reflective surface having a thickness between 0.5 and 10 nm.

8. The method of claim 1, wherein the depositing a metal on the layer of the semiconductor stack to form a reflective surface having a thickness between 0.5 and 10 nm comprises:
   depositing a metal on one or more underlayers or a substrate, to form a reflective surface having a thickness between 0.5 an 10 nm, after cleaning of a photoresist layer or a photoresist system off the semiconductor stack.

9. The method of claim 1, wherein the imaging the reflective surface on the layer of the semiconductor stack to identify the one or more defects or structures within the layer comprises:
   imaging the reflective surface on the layer of the semiconductor stack, with an optical imaging system, to identify one or more defects or structures within the layer.

10. The method of claim 9, wherein the imaging the reflective surface on the layer of the semiconductor substrate, with the optical imaging system, to identify one or more defects or structures within the layer comprises:
    imaging the reflective surface on the layer of the semiconductor stack, with at least one of a broadband plasma or laser scanning imaging system, to identify one or more defects or structures within the layer.

11. The method of claim 1, wherein the imaging the reflective surface on the layer of the semiconductor stack to identify one or more defects or structures within the layer comprises:
    imaging the reflective surface on the layer of the semiconductor stack, with a scanning electron microscopy (SEM) inspection system, to identify one or more defects or structures within the layer.

12. The method of claim 1, wherein the imaging the reflective surface on the layer of the semiconductor stack to identify one or more defects or structures within the layer comprises:
    inspecting the reflective surface on the layer of the semiconductor stack to identify one or more defects within the layer.

13. The method of claim 1, wherein the imaging the reflective surface on the layer of the semiconductor stack to identify one or more defects or structures within the layer comprises:
    performing a metrology measurement on the reflective surface on the layer of the semiconductor stack to identify one or more structures within the layer.

14. The method of claim 1, wherein the imaging the reflective surface on the layer of the semiconductor stack to identify one or more defects or structures within the layer comprises:

imaging the reflective surface on the layer of the semiconductor stack, with illumination between 100-1000 nm, to identify one or more defects or structures within the photoresist layer.

15. The method of claim 1, wherein the imaging the reflective surface on the layer of the semiconductor stack to identify one or more defects or structures within the layer comprises:

imaging the reflective surface on the layer of the semiconductor stack after development of a photoresist to identify one or more defects or structures within the photoresist.

16. The method of claim 1, wherein the imaging the reflective surface on the layer of the semiconductor stack to identify one or more defects or structures within the layer comprises:

imaging the reflective surface on the layer of the semiconductor stack after etch of a photoresist to identify the one or more defects or structures within one or more underlayers.

17. The method of claim 1, wherein the imaging the reflective surface on the layer of the semiconductor stack to identify one or more defects or structures within the layer comprises:

imaging the reflective surface on the layer of the semiconductor stack after cleaning of a photoresist to identify one or more defects or structures underlying the photoresist layer.

18. A method comprising:

receiving a semiconductor stack after development of a photoresist layer or a photoresist system disposed on the semiconductor stack;

depositing at least one of molybdenum, nickel, tungsten, rhodium, vanadium, or palladium on the photoresist layer or a toplayer of the photoresist system of the semiconductor stack, via top-down directional physical vapor deposition, to form a reflective surface having a thickness between 0.5 and 10 nm; and inspecting the reflective surface on the photoresist layer or a toplayer of the photoresist system of the semiconductor stack, with broadband plasma light, to identify one or more gap defects within the photoresist layer or the toplayer of the photoresist system of the semiconductor stack.

19. A characterization system comprising:

an imaging sub-system configured to acquire image data from a semiconductor stack including one or more layers, wherein the semiconductor stack includes a metal layer of at least one of molybdenum, nickel, tungsten, rhodium, vanadium, or palladium having a thickness between 0.5 and 10 nm deposited on a layer of the semiconductor stack to form a reflective surface on the layer, wherein a thickness of the metal layer on a side-wall of one or more patterns of the one or more layers of the semiconductor stack is less than a thickness of the metal layer on a top of one or more patterns of the one or more layers of the semiconductor stack;

a controller communicatively coupled to the imaging sub-system, the controller including one or more processors configured to execute program instructions causing the one or more processors to:

receive image data of the reflective surface on the layer of the semiconductor stack from the imaging sub-system; and identify one or more gap defects within the layer based on illumination reflected from the reflective surface.

20. The system of claim 19, wherein the imaging sub-system comprises:

a broadband plasma imaging sub-system.

21. The system of claim 19, wherein the imaging sub-system comprises:

a laser scanning imaging sub-system.

22. The system of claim 19, wherein the imaging sub-system comprises:

a scanning electron microscopy (SEM) imaging sub-system.

23. The system of claim 19, wherein the semiconductor stack comprises:

a substrate;

a mask disposed on the substrate;

one or more underlayers deposited on the substrate;

at least one of a photoresist layer or a photoresist system disposed on the one or more underlayers or substrate; and the metal layer having a thickness between 0.5 and 10 nm deposited on a layer of the semiconductor stack to form a reflective surface on the layer.

24. The system of claim 23, wherein the photoresist layer comprises at least one of a chemically amplified photoresist, a photoresist containing metal, or a metal oxide photoresist.

25. The system of claim 23, wherein the one or more underlayers comprises an organic or inorganic underlayer or underlayers.

26. The system of claim 19, wherein the imaging sub-system is configured to:

image the reflective surface on the layer of the semiconductor stack after development of a photoresist to identify one or more defects or structures within the photoresist.

27. The system of claim 19, wherein the imaging sub-system is configured to:

image the reflective surface on the layer of the semiconductor stack after etching of a photoresist to identify one or more defects or structures within the photoresist.

28. The system of claim 19, wherein the imaging sub-system is configured to:

image the reflective surface on the layer of the semiconductor stack after cleaning of a photoresist to identify the one or more defects or structures underlying the photoresist.

29. A method of characterizing a semiconductor stack comprising:

receiving a semiconductor stack including one or more layers;

depositing a metal on a layer of the semiconductor stack to form a reflective surface having a thickness between 0.5 and 10 nm via top-down directional physical vapor deposition; and imaging the reflective surface on the layer of the semiconductor stack to identify one or more gap defects within the layer.

30. The method of claim 29, wherein the semiconductor stack comprises:

a substrate;

a mask disposed on the substrate;

one or more underlayers deposited on the substrate; and at least one of a photoresist layer or a photoresist system disposed on the one or more underlayers or substrate.

31. The method of claim 30, wherein the photoresist layer comprises at least one of a chemically amplified photoresist, a photoresist containing metal, or a metal oxide photoresist.

32. The method of claim 30, wherein the one or more underlayers comprises an organic or inorganic underlayer or underlayers.

33. The method of claim 29, wherein the depositing a metal on a layer of the semiconductor stack to form a reflective surface having a thickness between 0.5 and 10 nm via physical vapor deposition comprises:
depositing a metal on a layer of the semiconductor stack to form a reflective surface having a thickness between 0.5 and 10 nm via top-down directional physical vapor deposition.

34. The method of claim 29, wherein the depositing a metal on a layer of the semiconductor stack to form a reflective surface having a thickness between 0.5 and 10 nm via physical vapor deposition comprises:
depositing a metal on a photoresist layer or a topcoat of a photoresist system after development of the photoresist layer of the semiconductor stack to form a reflective surface having a thickness between 0.5 and 10 nm via physical vapor deposition.

35. The method of claim 29, wherein the depositing a metal on a layer of the semiconductor stack to form a reflective surface having a thickness between 0.5 and 10 nm via physical vapor deposition comprises:
depositing a metal on a photoresist layer or a topcoat of a photoresist system after etching of the photoresist layer of the semiconductor stack to form a reflective surface having a thickness between 0.5 and 10 nm via physical vapor deposition.

36. The method of claim 29, wherein the depositing a metal on a layer of the semiconductor stack to form a reflective surface having a thickness between 0.5 and 10 nm via physical vapor deposition comprises:
depositing a metal on one or more underlayers or a substrate, to form a reflective surface having a thickness between 0.5 an 10 nm, after cleaning of a photoresist layer or a photoresist system off the semiconductor stack, via physical vapor deposition.

37. The method of claim 29, wherein the imaging the reflective surface on the layer of the semiconductor stack to identify the one or more defects or structures within the layer comprises:
imaging the reflective surface on the layer of the semiconductor stack, with an optical imaging system, to identify one or more defects or structures within the layer.

38. The method of claim 37, wherein the imaging the reflective surface on the layer of the semiconductor substrate, with the optical imaging system, to identify one or more defects or structures within the layer comprises:
imaging the reflective surface on the layer of the semiconductor stack, with at least one of a broadband plasma or laser scanning imaging system, to identify one or more defects or structures within the layer.

39. The method of claim 29, wherein the imaging the reflective surface on the layer of the semiconductor stack to identify one or more defects or structures within the layer comprises:
imaging the reflective surface on the layer of the semiconductor stack, with a scanning electron microscopy (SEM) inspection system, to identify one or more defects or structures within the layer.

40. The method of claim 29, wherein the imaging the reflective surface on the layer of the semiconductor stack to identify one or more defects or structures within the layer comprises:
inspecting the reflective surface on the layer of the semiconductor stack to identify one or more defects within the layer.

41. The method of claim 29, wherein the imaging the reflective surface on the layer of the semiconductor stack to identify one or more defects or structures within the layer comprises:
performing a metrology measurement on the reflective surface on the layer of the semiconductor stack to identify one or more structures within the layer.

42. The method of claim 29, wherein the imaging the reflective surface on the layer of the semiconductor stack to identify one or more defects or structures within the layer comprises:
imaging the reflective surface on the layer of the semiconductor stack, with illumination between 100-1000 nm, to identify one or more defects or structures within the photoresist layer.

43. The method of claim 29, wherein the imaging the reflective surface on the layer of the semiconductor stack to identify one or more defects or structures within the layer comprises:
imaging the reflective surface on the layer of the semiconductor stack after development of a photoresist to identify one or more defects or structures within the photoresist.

44. The method of claim 29, wherein the imaging the reflective surface on the layer of the semiconductor stack to identify one or more defects or structures within the layer comprises:
imaging the reflective surface on the layer of the semiconductor stack after etch of a photoresist to identify the one or more defects or structures within one or more underlayers.

45. The method of claim 29, wherein the imaging the reflective surface on the layer of the semiconductor stack to identify one or more defects or structures within the layer comprises:
imaging the reflective surface on the layer of the semiconductor stack after cleaning of a photoresist to identify one or more defects or structures underlying the photoresist layer.

* * * * *